United States Patent [19]  
Duncen et al.

[11] Patent Number: 4,549,087
[45] Date of Patent: Oct. 22, 1985

[54] LEAD SENSING SYSTEM

[75] Inventors: Robert J. Duncen, Magnolia; Richard B. Maxner, Danvers; Jean A. McLean, South Hamilton; William H. Mirley, Jr., North Reading, all of Mass.

[73] Assignee: USM Corporation, Farmington, Conn.

[21] Appl. No.: 451,921

[22] Filed: Dec. 27, 1982

[51] Int. Cl.$^4$ .......................................... G01H 21/86
[52] U.S. Cl. ................................ 250/561; 250/223 R; 250/227; 29/566.3
[58] Field of Search ............... 250/223 R, 561, 227; 324/73 PC; 140/139, 147; 364/475; 29/566.3, 564.1; 356/399, 400, 241

[56] References Cited

U.S. PATENT DOCUMENTS

| | | | |
|---|---|---|---|
| 2,896,213 | 7/1959 | Alderman et al. | 1/102 |
| 3,188,478 | 6/1965 | Binks | 250/219 |
| 3,771,325 | 11/1973 | Sweeney et al. | 66/50 |
| 4,027,982 | 6/1977 | Ohishi | 250/561 |
| 4,063,347 | 12/1977 | Woodman, Jr. | 29/564.1 |
| 4,122,874 | 10/1978 | Tyner et al. | 140/147 |
| 4,218,817 | 8/1980 | Takano | 29/741 |
| 4,264,202 | 4/1981 | Gugliotta et al. | 250/561 |
| 4,266,674 | 5/1981 | Bell et al. | 250/223 |
| 4,286,379 | 9/1981 | Kawa et al. | 29/705 |
| 4,292,727 | 10/1981 | Maxner | 29/566.3 |
| 4,499,649 | 2/1985 | Maxner | 29/566.3 |

Primary Examiner—David C. Nelms
Assistant Examiner—James Gatto
Attorney, Agent, or Firm—William F. White

[57] ABSTRACT

A system is disclosed for checking on the presence or absence of inserted leads of a component into the openings of a printed circuit board. The system is utilized within a component insertion machine wherein a plurality of optical lead sensors are preferably located within the cut and clinch mechanism. A computer system associated with the optical lead sensors compares the optical readings of the lead sensors with predefined data relating to the presence or absence of leads for each particular component being inserted.

14 Claims, 12 Drawing Figures

Fig. 9

| NUMBER OF LEADS | P1 | P2 | P3 | P4 | P5 | P6 | P7 | P8 | P9 | P10 | P11 | P12 | P13 | P14 | P15 | P16 | P17 | P18 | P19 | P20 |
|---|---|---|---|---|---|---|---|---|---|---|---|---|---|---|---|---|---|---|---|---|
| 2 | 1 | 0 | 0 | 0 | 0 | 0 | 0 | 0 | 0 | 0 | 0 | 0 | 0 | 0 | 0 | 0 | 0 | 0 | 0 | 1 |
| 4 | 1 | 1 | 0 | 0 | 0 | 0 | 0 | 0 | 0 | 0 | 0 | 0 | 0 | 0 | 0 | 0 | 0 | 0 | 1 | 1 |
| ... | | | | | | | | | | | | | | | | | | | | |
| 16 | 1 | 1 | 1 | 1 | 1 | 1 | 1 | 1 | 0 | 0 | 0 | 0 | 1 | 1 | 1 | 1 | 1 | 1 | 1 | 1 |
| 20 | 1 | 1 | 1 | 1 | 1 | 1 | 1 | 1 | 1 | 1 | 1 | 1 | 1 | 1 | 1 | 1 | 1 | 1 | 1 | 1 |
| 21 | 1 | 1 | 1 | 1 | 0 | 1 | 1 | 0 | 0 | 0 | 0 | 0 | 1 | 1 | 1 | 0 | 1 | 1 | 1 | 1 |

# LEAD SENSING SYSTEM

BACKGROUND OF THE INVENTION

Printed circuit boards are extensively used in the electronics industry and are usually provided with preformed openings or holes into which the leads of an electrical component are inserted. These electrical components are inserted into the boards by automatic equipment which is programmed to rapidly place the components into the proper holes of the printed circuit board. An example of such equipment is illustrated in U.S. Pat. No. 4,063,347. After the component is inserted into the board, the leads are cut and clinched or formed so that the component is locked onto the board. An example of such a cut-clinch unit is illustrated in U.S. Pat. No. 4,292,727 and the disclosure thereof is incorporated herein by reference.

During this operation of automatically inserting components into printed circuit boards it is necessary to provide inspection and checking means at each stage of the operation to assure that the operation was performed properly. One such inspection should be to determine that all the leads of the dual-in-line component are properly placed down through the openings in the board.

OBJECTS OF THE INVENTION

It is an object of this invention to provide a system which checks for the presence of each inserted lead of a dual-in-line component during the operation of automatically inserting the component into the board.

It is another object of this invention to interrupt the automatic operation of the insertion machine in the event that the presence of an inserted lead is not detected.

It is still another object of this invention to provide an indication to the operator of the insertion machine when a missed insertion of a lead occurs.

SUMMARY OF THE INVENTION

The above and other objects are achieved by a component lead sensing system having a plurality of fiber optic lead sensors preferably arranged within a cut and clinch mechanism of the component insertion machine. Each lead sensor includes a sensing circuit associated therewith that produces a binary status signal indicative of the presence or absence of a lead. A computer system is operative to read the status of each lead sensor prior to the insertion of the component leads so as to verify that the lead sensors are functioning properly. The component leads are thereafter inserted into the holes of the printed circuit board and the status of each lead sensor is again read. The status of each lead sensor is thereafter checked for being in accordance with predefined lead information for the component being inserted. The leads are thereafter cut and clinched in the event that all leads defined by the lead information are found to be present.

In accordance with the invention, the insertion machine is not allowed to proceed to the cut and clinching process in the event that the presence of a lead is not confirmed. A message is also transmitted to the operator of the machine indicating that a missed lead insertion has occurred.

It is also to be noted that a message preferably is transmitted to the operator concerning the improper functioning of a lead sensor when such a condition is found to unexpectedly exist. This is also accompanied by a stoppage of the automatic inserting process of the component insertion machine.

DESCRIPTION OF THE DRAWINGS

FIG. 9 is an illustration of certain tabular information utilized by the central processor.

DESCRIPTION OF THE PREFERRED EMBODIMENT

Figure 1:
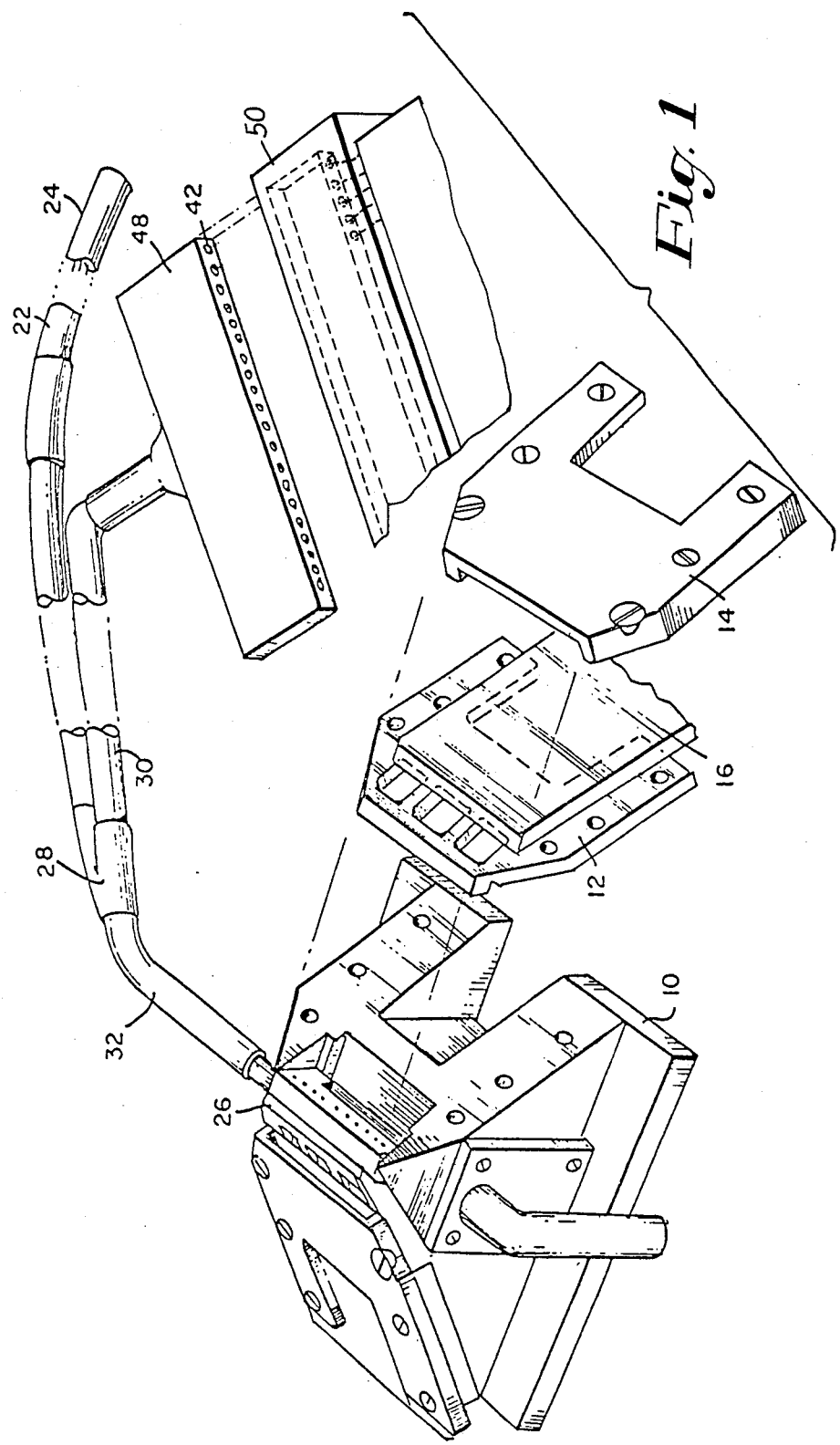
FIG. 1 is a perspective view of the fiber optics lead sensor of this invention.
Figure 2:
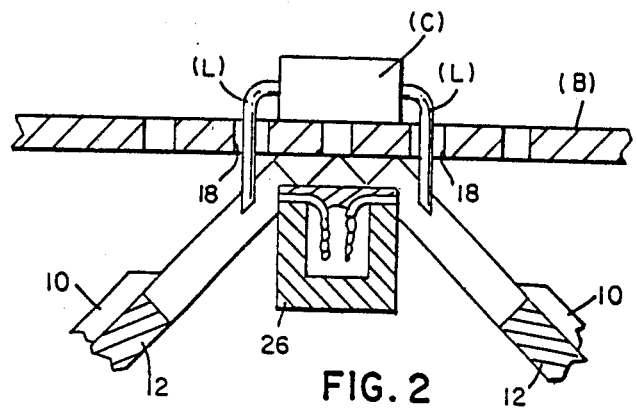
FIG. 2 is an enlarged sectional view showing the lead sensor being located in the cut-clinch unit and sensing lead location in the board.

Attention is now directed to the drawings which illustrate the lead sensing system of this invention. In FIG. 1 there is illustrated a cut-clinch unit comprising a block 10 on which fixed knives 12 are carried by a knife retainer 14 in which movable knife 16 is positioned. This cut-clinch unit is the same as illustrated in commonly assigned U.S. Pat. No. 4,292,727 to Richard B. Maxner and the disclosure of that patent is incorporated herein by reference. The cut-clinch unit is adapted to be positioned under the electrical component (C) which has its leads (L) inserted in the openings 18 of printed circuit board (B) as illustrated in FIG. 2.

At this stage of assembly of electronic components, it is desirable for the machine computer control to know that all the leads of the component are properly positioned down through the openings in the printed circuit board. To this end a fiber optic lead sensing system is introduced into the cut and clinch unit. This system includes a bundle of fiber optic input filaments 22 which pass light from a common light source 24 to a housing 26 located between the knives of the cut and clinch unit. The bundle of input filaments is joined at a junction 28 to a bundle of fiber optic output filaments 30 which carry reflected light back from the housing 26 in a manner which will be descibed hereinafter. It is to be noted that the input filament bundle 22 and the output filament bundle 30 form a combined bundle 32 of input and output filaments going into the housing 26. It is to be furthermore noted that each filament will preferably have a diameter in the range of three to ten thousandths of an inch.

Figure 3:
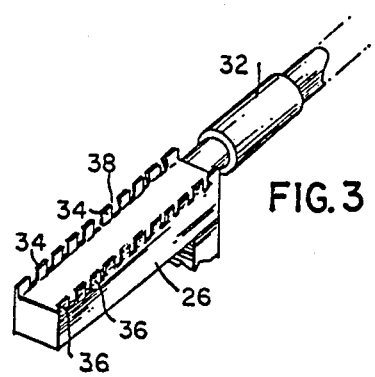
FIG. 3 is an enlarged view of the lead sensor housing with the fiber optic input and output bundle.
Figure 4:
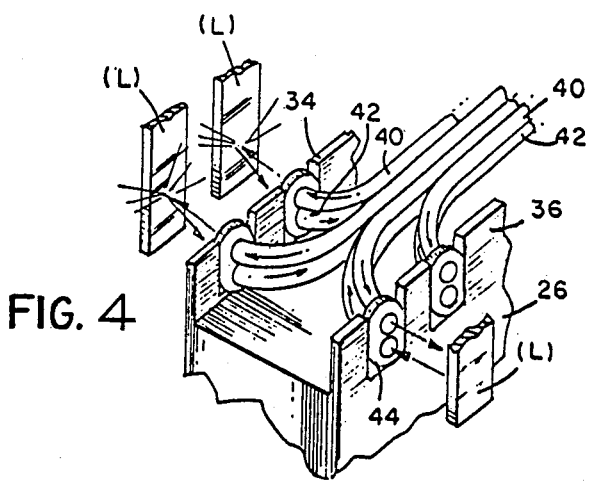
FIG. 4 is an enlarged view of the fiber optic input and reflection pickup from the component leads.

Referring to FIGS. 3 and 4, the housing 26 is seen to have a plurality of spaced upstanding opposed posts 34, 36 with the spaces 38 therebetween being equal to the approximate center spacing of adjacent leads of the dual-in-line component. Positioned between the posts 34, 36 in spaces 38 are the input 40 and output 42 filaments of the sensor. These filaments can be held in position by any convenient means such as holders 44. It is to be noted that the aforementioned structure of FIGS. 1–4 is disclosed in commonly assigned U.S. application Ser. No. 407,293, filed on Aug. 11, 1982 in the name of Richard B. Maxner and entitled, "All Lead Sensor", now U.S. Pat. No. 4,499,649.

Figure 5:
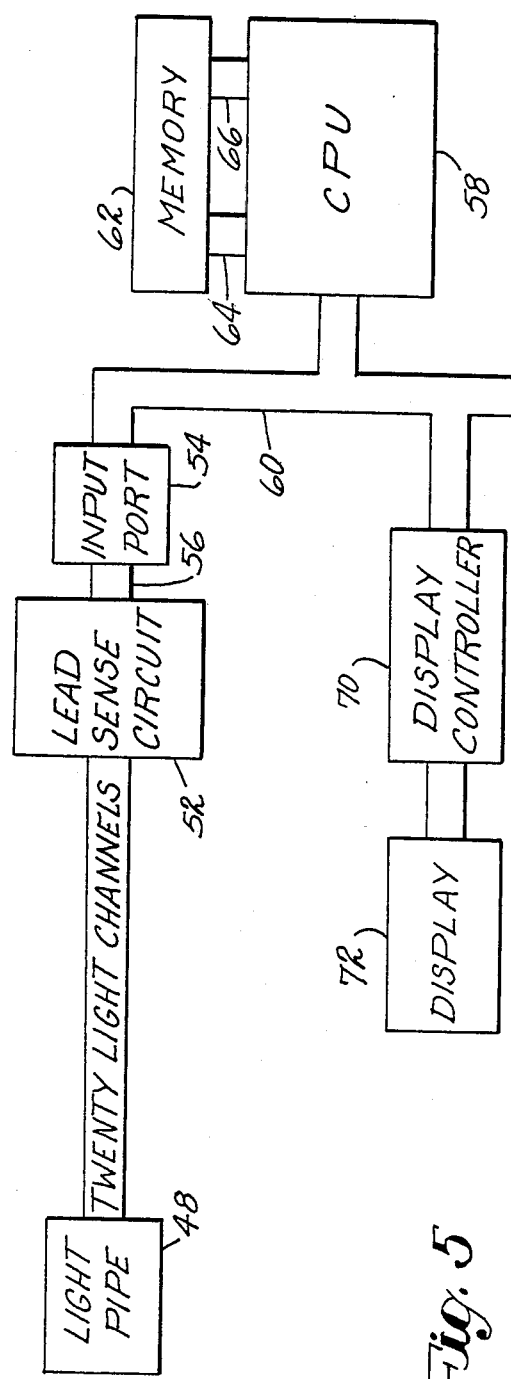
FIG. 5 is an illustration of a component having numbered leads with positional significance relative to each lead sense circuit of FIG. 6.

It can thus be seen that as the component leads (L) are in position, the light emitted by input filaments 40 is reflected off the lead (see FIG. 4) and picked-up by output filaments 42. This light from individual output filaments 42 is transmitted through individual light channels in a light pipe coupling device 48 containing separate output filaments. The light is thereafter projected onto a set of photo transducers within a housing 50. The number of light channels and photo transducers corresponds to the preferred number of output filaments that are to be associated with the maximum number of leads (L). In this regard, the maximum number of leads for the component (C) is preferably twenty. Referring to FIG. 5, a twenty lead dual-in-line component is illustrated with numbered leads $L_1$ through $L_{20}$. This component requires twenty input filament 40 and twenty output filaments 42 arranged opposite the twenty leads. In other words, an input filament 40 and an output filament 42 is to be located in a respective holder 44 opposite each of the respective leads $L_1$ through $L_{20}$ in the manner illustrated in FIG. 4. Each such pair of input and output filaments constitute a particular fiber optic lead sensor capable of sensing the presence or absence of a respective lead of the twenty lead component.

It is to be appreciated that a component having less than twenty leads will present leads to only a portion of the twenty fiber optic lead sensors. In this regard, a two lead component consisting of only leads $L_1$ and $L_{20}$ will result in only two particular fiber optic lead sensors reflecting light from an inserted lead.

Figure 6:
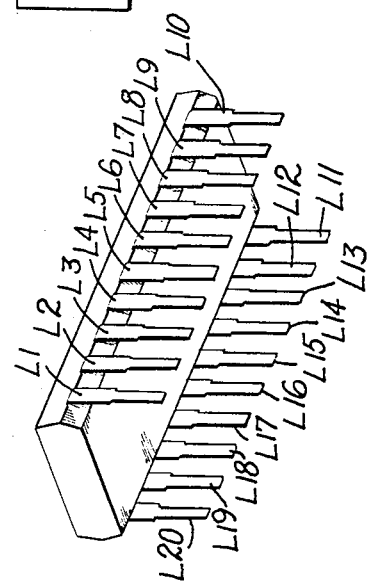
FIG. 6 is a block diagram of the computer system associated with the fiber optic output.

Referring to FIG. 6, the light pipe coupling device 48 is illustrated relative to various blocks of circuitry within a computer control system. The light pipe coupling device is seen to provide twenty separate channels of light to a lead sense circuit 52. Each light channel receives an output filament 42 associated with the particular fiber optic lead sensor. The lead sense circuit 52 is preferably located in the housing 50 of FIG. 1 and includes a photo transducer in the form of a photo resistor associated with each light channel. The photo resistors are preferably located in the housing 50 in such a manner as to directly communicate with only the particular light channel associated therewith. Each photo resistor is increasingly conductive in response to the presence of light in its respective channel. As will be explained in detail hereinafter, each photo resistor has a circuit associated therewith which defines a logic level signal indicative of the conductive status of the photo resistor. These logic level signals are fed in parallel to an input port 54 via a bus 56. The input port is preferably an INTEL circuit 8255 which will report the status of a signal applied to one of its predefined inputs when queried by a central processor. The central processor is labelled 58 in FIG. 6 and is preferably an INTEL 8080 microprocessor. The central processor communicates with the input port 54 via an address and data bus 60. The bus 60 is preferably a multibus available from INTEL Corporation with the INTEL 8080 microprocessor. The central processor identifies particular inputs of the input port 54 by issuing specific addresses on the address and data bus 60. Eight separate inputs can be identified by a single address. The binary statuses of the eight identified inputs are then provided back to the central processor as data via the bus 60. In this manner, the central processor is capable of reading the current binary status of each of the twenty logic level signals from the lead sense circuit 52. The central processor 58 also communicates with a randomly addressable memory 62 via an address bus 64 and a data bus 66. The memory 62 contains the program which is utilized by the central processor 58 to sequentially command the various operations of a component insertion machine. The machine commands are applied to a machine control 68 via the bus 60. The machine control includes an X-Y positioning system for positioning a printed circuit board relative to a component insertion head. The machine control furthermore includes a system for locating and transporting a component to the insertion head and thereafter causing the insertion head to move the component into position above the positioned printed circuit board. The machine control still furthermore includes an actuated pusher which pushes the component into contact with the board and pushes its leads into the positioned printed circuit board. The machine control also includes a cut and clinch system which cuts and clinches the inserted leads of the component. All such machine control functions are under program control of the central processor. These functions may be found in component insertion machines commonly referred to as "DIP Insertion Machines" available from the Dyna/Pert Division of Emhart Corporation. The central processor also communicates with a display controller 70 via the bus 60. The display controller 70 receives data representative of character information to be displayed on a display device 72. The controller 70 and display device 72 can be any of a number of commercially available units capable of responding to character information present on the bus 60.

Figure 7:
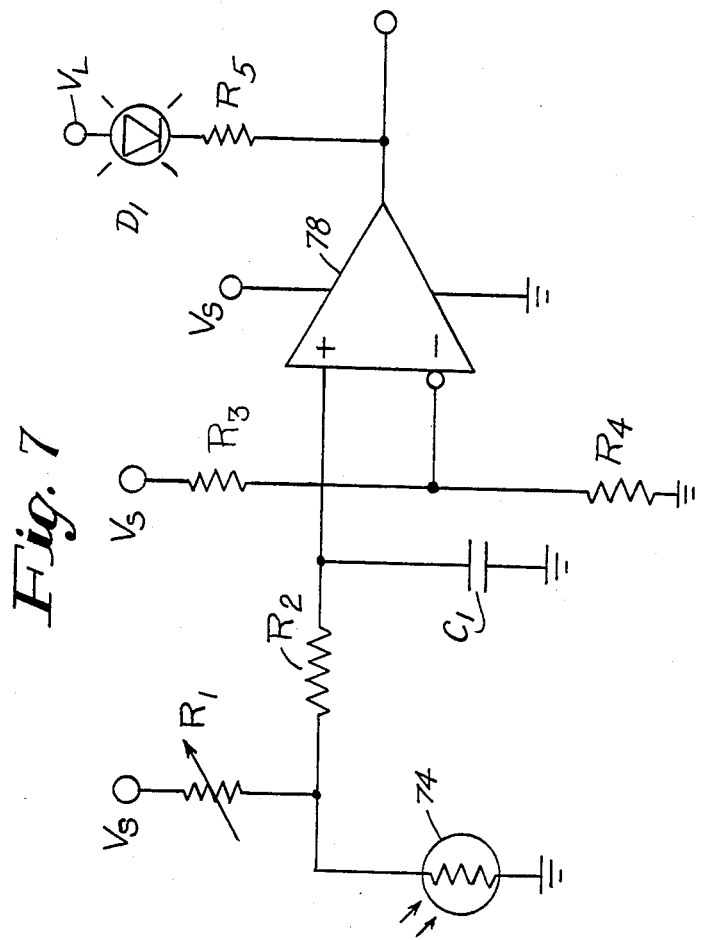
FIG. 7 is a circuit diagram of a lead sense circuit within the computer system of FIG. 6.

Referring now to FIG. 7, a circuit associated with a single photo resistor 74 within the lead sense circuit 52 is illustrated in detail. The photo resistor 74 is connected between a supply voltage $V_s$ and ground. A variably set resistance $R_1$ defines the voltage upstream of the photo resistor 74. A resistance $R_2$ in combination with a capacitor $C_1$ filters any noise conditions in the upstream voltage before application to the positive terminal of an operational amplifier 78. The operational amplifier is preferably an LM339 available from National Semiconductor Corporation. The thus applied voltage is compared with a predefined voltage that is inverted at the negative terminal of the operational amplifier. The predefined voltage is established by resistors $R_3$ and $R_4$ situated between the supply voltage and ground. The predefined voltage at the negative terminal will be less than the voltage appearing at the positive terminal when the photo resistor 74 is in a highly resistive state. This will result in the output of the operational amplifier 78 being in a logically high voltage condition.

The voltage at the positive terminal will drop however when the photo resistor 74 becomes less resistive as a result of light appearing in the light channel associated therewith. This voltage drop relative to the predefined voltage at the negative terminal will cause the output of the differential amplifier to change signal state. In this regard, the output voltage will drop logically low or to a binary zero signal state. It is to be noted that the output voltage of the amplifier 78 is referenced with respect to a logic level voltage source $V_L$ having a diode $D_1$ and resistance $R_5$ associated therewith. This output configuration will define compatible voltage and current conditions for the predefined input of the port 54. In this regard, the input port 54 is preferably on INTEL 8255 circuit having transistor to transistor logic which must be compatible with each output of the lead sense circuit.

In summary, it is to be appreciated that each output of the lead sense circuit 52 will either be in a binary one or a binary zero signal state depending on the resistive status of a particular photo resistor. This is in turn dependent on whether or not light appears in a light channel within the light pipe 48 associated with the photo resistor. Light will be present if a lead L appears opposite a filament 42 associated with the light channel. In this regard, it will be remembered that the presence of a lead L reflects light from an input filament 40 to an output filament 42. The reflected light causes the photo resistor 74 to become less resistive resulting in a voltage drop being experienced at the positive terminal of the operational amplifier 78. This produces a binary zero signal condition at the output of the lead sense circuit 52. A binary one signal condition will otherwise occur at the output of the lead sense circuit. It is hence to be appreciated that a binary zero signal condition will indicate the presence of a lead opposite a given fiber-optic lead sensor whereas a binary one signal condition will indicate the absence of a lead.

The signal conditions appearing at the twenty outputs of the lead sense circuit will be applied to twenty predefined inputs of the input port 54. Each such input will constitute a single bit of information concerning the binary status of a particular output of the lead sense circuit. The inputs of the input port 54 are preferably numbered in the same manner as the numbered leads for the twenty lead component of FIG. 5. In other words, the first numbered input to the port 54 will correspond with the lead $L_1$ whereas the twentieth numbered input will correspond with the lead $L_{20}$.

Figure 8:
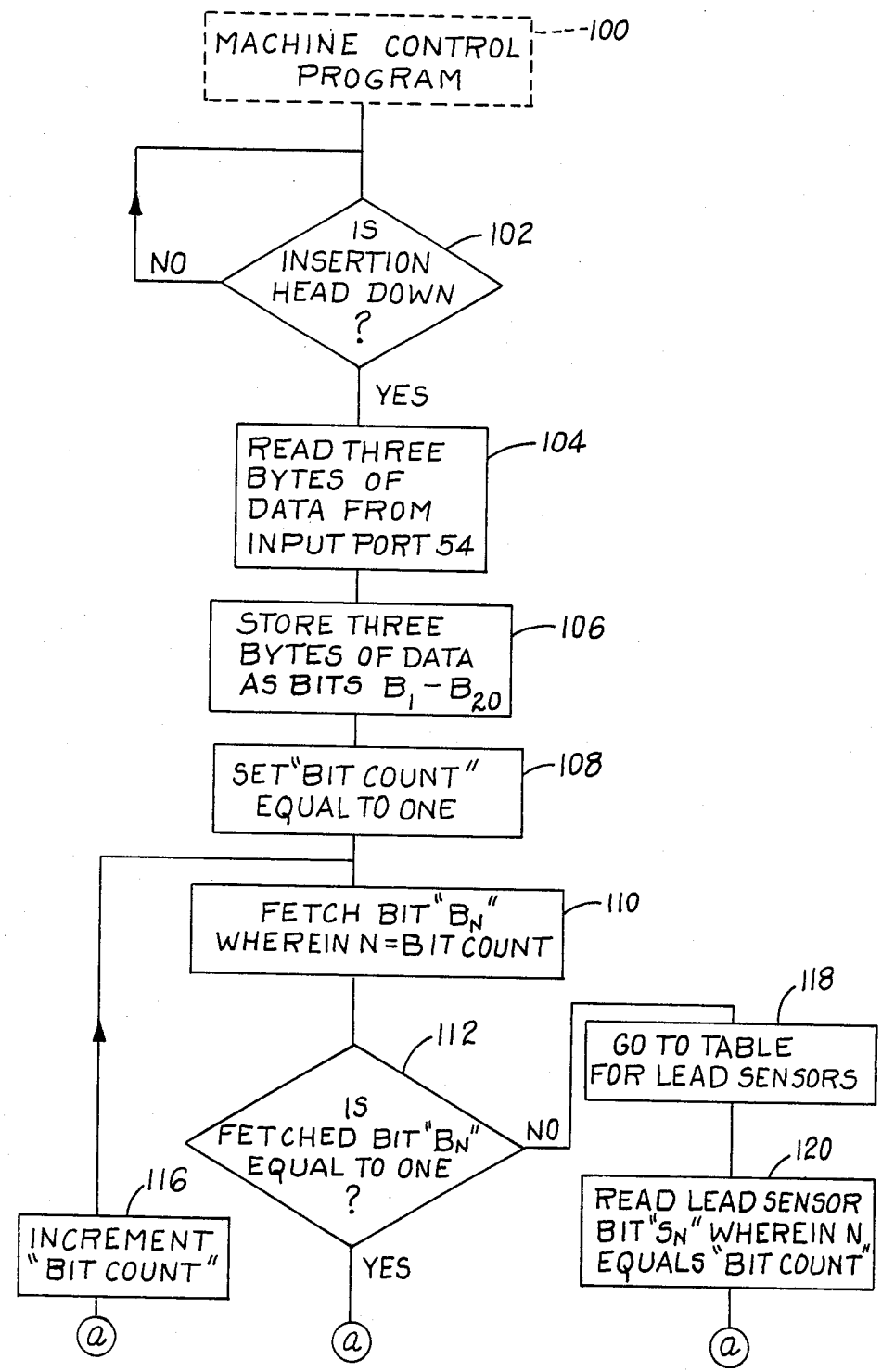
FIGS. 8–8C is a flow chart illustrating the operation of the central processor within the computer system of FIG. 6.
Figure 8A:
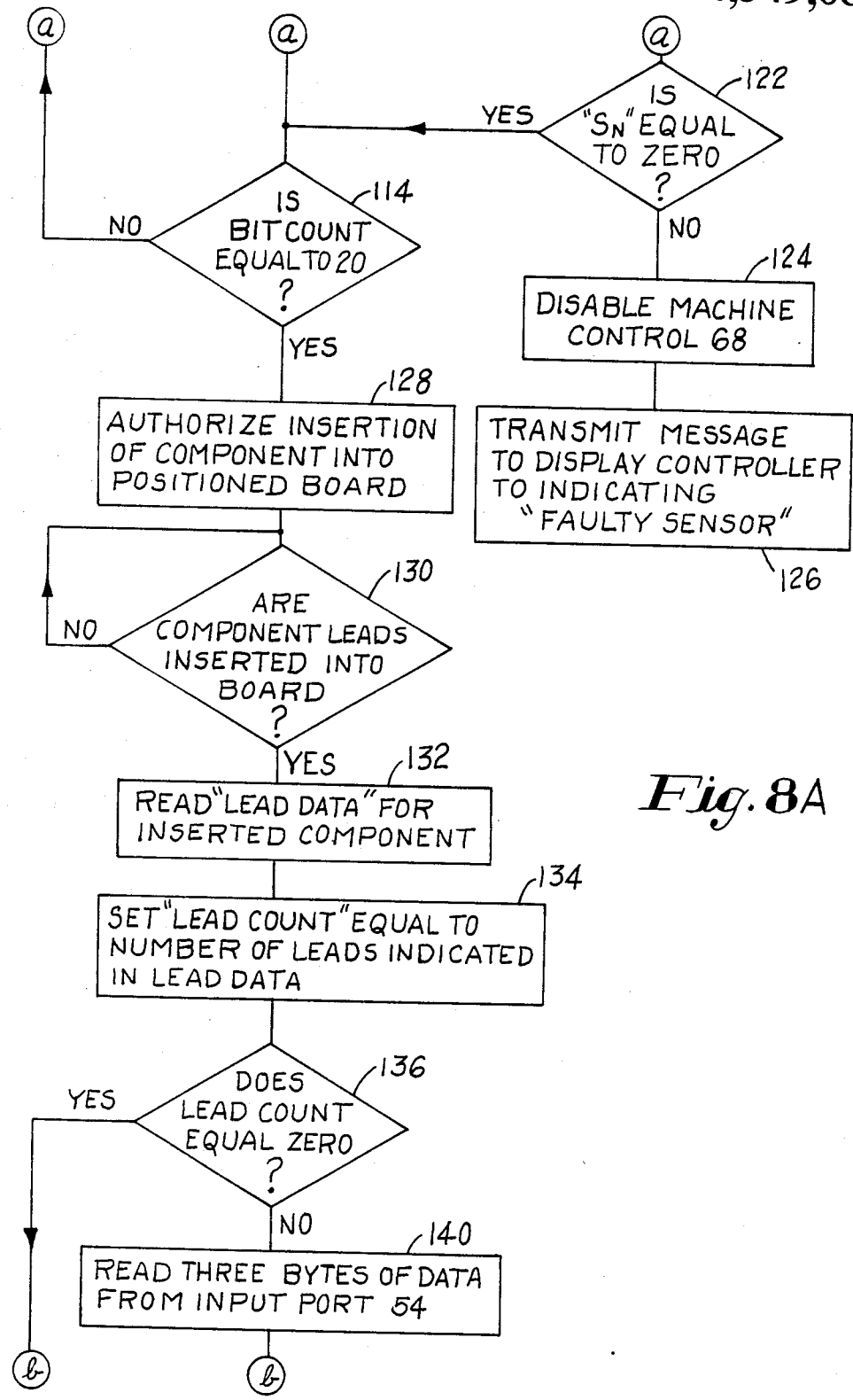
Figure 8B:
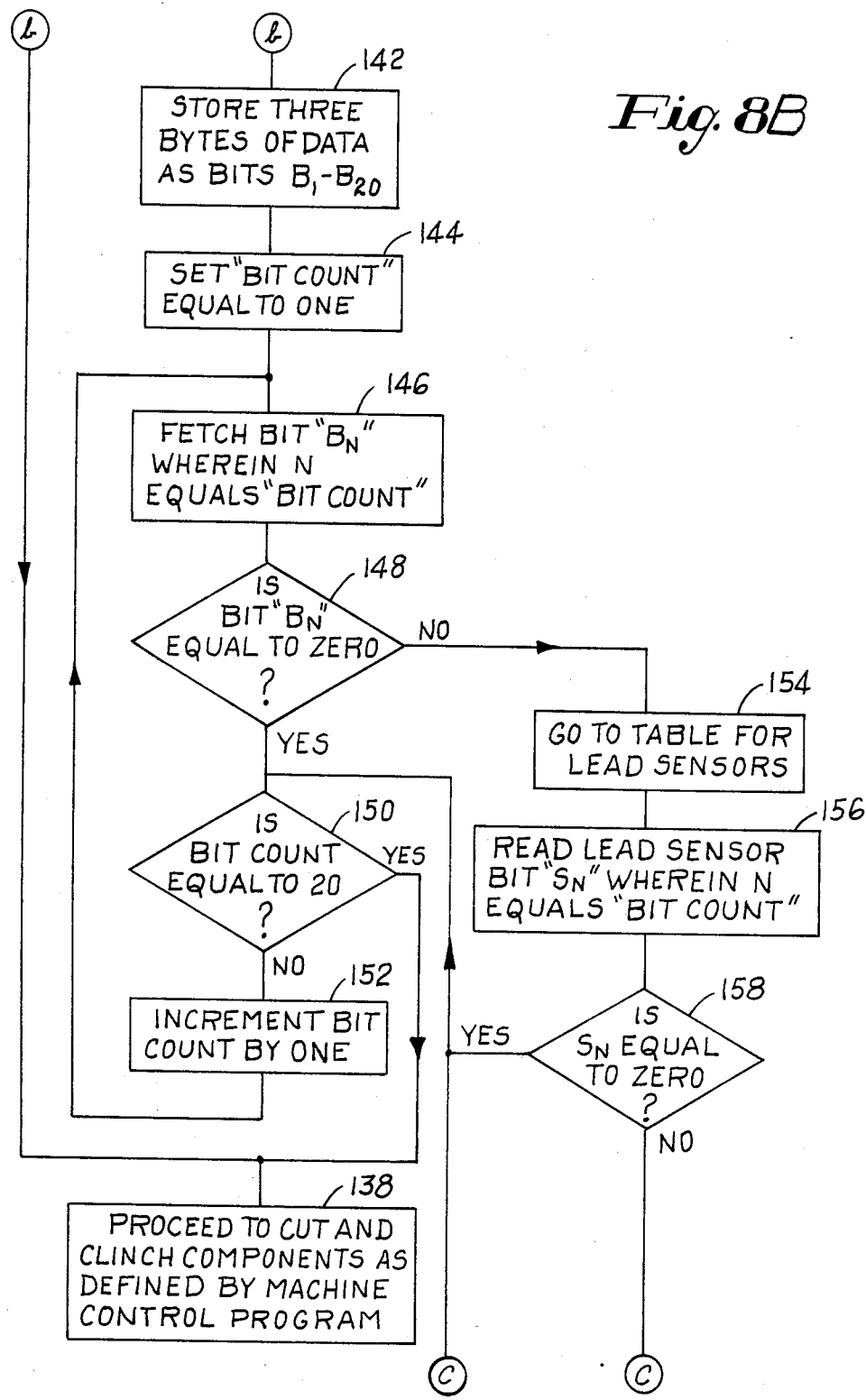
Figure 8C:
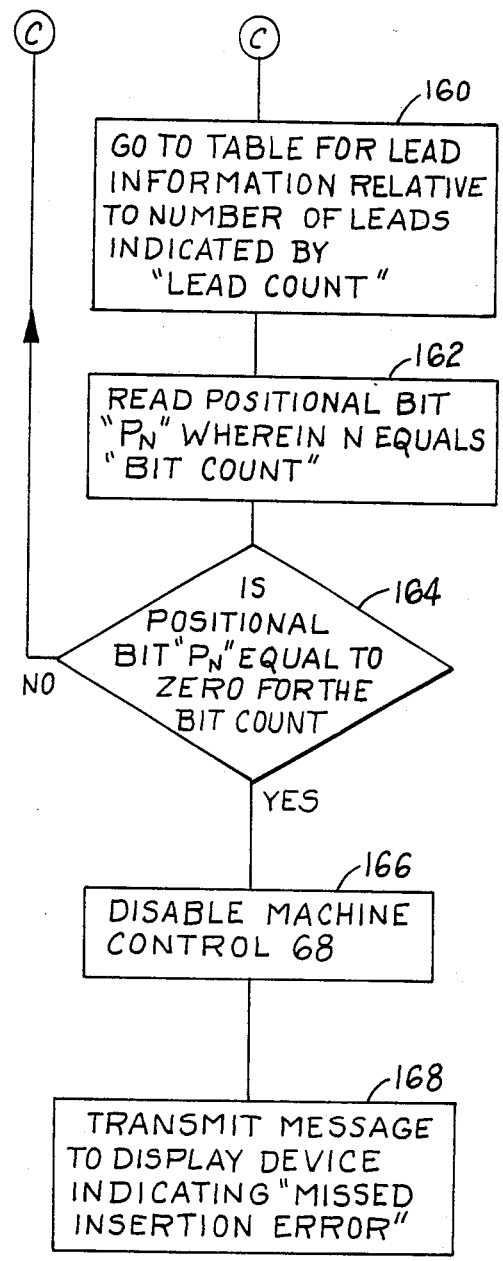

Referring now to FIGS. 8-8C, the computer program which dictates the lead sense operation of the central processor unit 58 within the computer system of FIG. 6 is disclosed in flow chart form. It is to be appreciated that additional programs reside within the computer system of FIG. 6. These programs would include a machine control program. As has been previously explained, this program will cause a component to be selected and positioned for insertion relative to a printed circuit board. This program will also include the positioning of the printed circuit board for receipt of the selected component. All of the above steps will have occurred within the machine control program broadly denoted in outline form and labelled 100 in FIG. 8.

The program of the present invention begins at a point following the above functional events. Specifically, the program begins with a step 102 wherein the question is asked as to the status of the component insertion head. In this regard, the machine control program will have commanded the machine control 68 to move the insertion head downward toward a positioned printed circuit board. The machine control 68 will normally have a switch provided therein which indicates to the central processor unit 58 when the insertion head has reached its downward position. Until this has occurred, the central processor will merely recycle through the "NO" path associated with step 102. It is to be noted that when the insertion head has reached a downward position, the component will still remain suspended above the printed circuit board. At this time, the central processor proceeds to a step 104 and reads three bytes of data from the input port 54. As has been previously explained, the input port 54 will have twenty bits of information indicating the binary status of twenty lead sensors. The three bytes of data which are thus read will contain numbered bits $B_1$ through $B_{20}$ corresponding to numbered lead positions of the twenty lead component of FIG. 6. Bits $B_1$ through $B_8$ will be read within the first byte of data whereas bits $B_9$ through $B_{16}$ and bits $B_{17}$ through $B_{20}$ will be read within the second and third bytes of information. These bytes of data are stored as recallable bits $B_1$ through $B_{20}$ in a step 106. The central processor next proceeds to a step 108 and sets a software reference "BIT COUNT" equal to one. The central processor proceeds to a step 110 and fetches the bit $B_N$ wherein N equals the current value of "BIT COUNT". The central processor now proceeds to a step 112 and checks to see whether the fetched bit "$B_N$" is equal to one. In this regard, it will be remembered that a lead sensor should have a binary status of one when no lead appears opposite the one or more output filament associated therewith. This should be the case at step 112 since the component leads have yet to be inserted into the printed circuit board. The central processor should hence normally find the fetched bit $B_N$ to be equal to one and exit on the "YES" path to a step 114. The central processor checks in step 114 to see whether the "BIT COUNT" is equal to twenty since there are only twenty lead sensors to be checked for their respective binary status. Until this occurs, the central processor proceeds along a "NO" path to a step 116 wherein the "BIT COUNT" is incremented and the next bit "$B_N$" is fetched in the step 110.

Referring now again to step 112, when the fetched bit is found not to be equal to one, the "NO" path is pursued to a step 118. At this point it is to be understood that a particular lead sensing circuit defined by the then current "BIT COUNT" is incorrectly indicating the presence of a lead. The central processor proceeds to a step 118 which consists of referring to a table for lead sensors. This table preferably comprises a field of twenty bits "$S_N$" wherein each bit defines the operative status of a particular lead sensor associated with one of the numbered leads of the twenty lead component in FIG. 6. The binary status of each bit is preferably one for a fully operational sensor and zero for an inoperative sensor. The central processor reads the particular bit "$S_N$" identified by the then current "BIT COUNT" in a step 120. The central processor next inquires as to whether the thus read bit is equal to zero in a step 122. In the event that the particular lead sensor has been previously considered as operative, then the bit "$S_N$" will be one, prompting the central processor to proceed along the "NO" path from step 122 to a step 124. The central processor will disable the machine control 68 at this point. This can be accomplished by simply not allowing any further control of the machine control 68 by the machine control program or simply disabling the cut and clinch mechanism within the machine control. In either event, the central processor proceeds to a step 126 wherein a "FAULTY SENSOR" message is transmitted to the controller 70 for display on the display 72. It is to be understood that the display message could also incorporate a numerical identification of the faulty sensor thus detected. This would merely be the number defined by the current "BIT COUNT".

Referring again to step 122, it is to be noted that if the particular lead sensor has previously been deemed inoperative, then the bit "$S_N$" will be zero. This will allow the central processor to proceed along a "YES" path back to step 114 wherein the bit count is checked for being equal to twenty. The central processor is now within the main loop of checking the bit status of all twenty bits on the input port 54. It is to be understood that if all bits indicate the absence of a lead being sensed (as per step 112) or if a particular lead sensor has been deemed inoperative (as per steps 118, 120 and 122), the central processor will proceed along a "YES" path to a step 128. At this point, the lead sensors will have been checked for proper functioning relative to the component that is now to be inserted. In this regard, the central processor in step 128 transmits a signal to machine control 68 which authorizes the insertion of the component. This is normally accomplished by disabling fingers which grip the component while simultaneously turning on a pusher which pushes the component leads into the board. The central processor now proceeds to a step 130 and checks as to whether the component leads are inserted into the board. This is preferably accomplished by awaiting a signal from machine control 68 indicating that the pusher mechanism has moved downwardly. This may include a switch which changes signal state when the pusher assumes the downward position. When this occurs the central processor proceeds to a step 132 and reads the lead data for the component. This information is preferably provided within the data base of the insertion program as part of the description for the component. Such a program describes the sequence of components that are to be inserted together with movement data describing how the printed circuit board is to be moved for receipt of each component. The data base for the insertion program is preferably organized in such a manner that all information pertaining to a particular component is located in a data field associated with an identification of the component. For instance, the lead data might immediately follow the movement data for the printed circuit board within the data field for the component. The lead data will in any event preferably be an accessible binary coded value within the data field. This value will usually be indicative of the number of leads for the given component. The central processor hence proceeds to a step 134 and sets a software reference "LEAD COUNT" equal to the number of leads indicated by the accessed lead data. The central processor now proceeds to a step 136 and inquires as to whether the "LEAD COUNT" equals zero. A zero numerical coding for lead data is merely a way of avoiding any lead sensing of the particular component. In this regard, the central processor proceeds along a "YES" path to a step 138 which constitutes a return to the machine control program. In particular, the central processor proceeds to the cutting and clinching of the component as defined within the machine control program. Referring again to step 136, it is to be noted that if the "LEAD COUNT" is other than zero, the central processor proceeds along a "NO" path to a step 140. At this point, it is to be understood that the component leads are physically inserted into the board and the lead sensors should each be reflecting the presence or absence of a lead. This information should be present at the input port 54 in the form of a bit input which either is a binary zero or a binary one for the absence of a lead. This bit information is read from the input port 54 as three bytes of data in step 140. This data is stored as bits $B_1$ through $B_{20}$ in step 142. The central processor now proceeds to a step 144 wherein the software reference "BIT COUNT" is set equal to one. The bit $B_N$ defined by the current "BIT COUNT" is brought forth in a step 146. The central processor now proceeds to step 148 and inquires as to whether the fetched bit "$B_N$" is equal to zero. It will be remembered that the binary status of a bit present on the input port 54 will be zero for a sensed lead. In the event that a lead is present, the central processor will exit on a "YES" path to a step 150 and inquire as to whether or not the "BIT COUNT" is now equal to twenty. In the event that the "BIT COUNT" is not equal to twenty, the central processor will proceed along a "NO" path to a step 152 and increment the "BIT COUNT" by one. The central processor now returns to step 146 and fetches the bit thus identified by the incremented "BIT COUNT". This will continue to occur until such time as the "BIT COUNT" either equals twenty or the bit "$B_N$" is other than zero. If the "BIT COUNT" equals twenty, the central processor will exit from the step 150 and proceed to step 138 which requires the central processor to return to the machine control program and proceed to cut and clinch the component.

Referring again to step 148, in the event that the bit "$B_N$" is not equal to zero, the central processor will proceed along a "NO" path to a step 154. It is to be appreciated in this instance that the non-zero status of the bit "$B_N$" indicates that a lead is not present at the particular lead sensor then being identified. The central processor proceeds to the table for lead sensors in a step 154. The lead sensor bit "$S_N$" defined by the particular "BIT COUNT" is read in step 156 and compared with zero in step 158. If "$S_N$" is equal to zero, the lead sensor is deemed inoperative and the central processor proceeds along a "YES" path back to step 150. It is to be appreciated that the significance of steps 154 through 158 is to disregard a particular bit reading from the input port 54 when a sensor has been previously determined to be inoperative. This inoperative status will moreover have been allowed to exist by the binary zero coding present within the lead sensor table. This will normally not occur and the sensor bit "$S_N$" identified by the "BIT COUNT" will be one. This will mean that the sensor is fully operative and that it is reliably indicating the absence of a lead by virtue of the bit $B_N$ being equal to one as determined in step 148. The central processor will hence proceed to a step 160. The central processor now goes to a table for lead information relative to the number of leads indicated by "LEAD COUNT". Such a table is illustrated in FIG. 9. Referring to FIG. 9, it is seen that a data field of twenty bits labelled $P_1$ through $P_{20}$ is provided for each component having a specified number of leads. Each numbered bit defines the position of a particular lead in the twenty lead component of FIG. 5. In this regard, bit $P_1$ defines the position of the lead $L_1$, whereas bit $P_{20}$ defines the position of lead $L_{20}$. Each bit is coded in such a manner that a binary one indicates the expected presence of a lead at the particular lead position and a binary zero indicates the expected absence of a lead at that position. In this regard, the first field of data is for a component having two leads. Bits $P_1$ and $P_{20}$ are seen to be one whereas the rest of the data field comprises zeroes. This accurately defines a two lead dual-in-line component wherein only two leads $L_1$ and $L_{20}$ would be present. In like manner, other standard lead size components are encoded in the table of FIG. 9. This includes the twenty lead dual-in-line component having a data field of all binary one bits.

It is to be noted that the table of FIG. 9 also has a component identified as having twenty-one leads. This actually represents a fictitious number of leads since provision has only been made for sensing twenty leads. The positional lead bit information for the fictitious number twenty-one actually represents a particular sixteen lead component wherein the fifth lead is missing on either side of the component. In this regard, a component of such configuration has been merely encoded within the insertion program as having a fictitious number of leads. It is to be appreciated that any number of component sizes having missing leads could be thus encoded in the insertion program and thereafter further defined in the table of FIG. 9.

Referring again to Step 160 within FIG. 8C, it is to be noted that the central processor is in a particular positional bit field as defined by the number of leads for the particular component that is to be inserted. The central processor in a step 162 reads the positional bit "$P_N$" in this field wherein N equals the "BIT COUNT". For instance, if the number of leads indicated for the component is "2" and the "BIT COUNT" is equal to one, the positional bit will be a binary one. This means that a lead is to be expected for this "BIT COUNT" value. The central processor proceeds to a step 164 and inquires as to whether the thus read positional bit is equal to zero. It is to be understood at this point that the central processor is merely checking to see whether a lead should be present. This will in fact be the case for the aforementioned two lead component. Since the bit in this instance equals one, the central processor will proceed along a "YES" path to a step 166 wherein the machine control 62 is caused to be disabled in the same manner as heretofore discussed in step 124. The central processor now proceeds to a step 168 and transmits a particular message to the display controller 70. This message will indicate a "MISSED INSERTION ERROR". It is to be appreciated that further information could be provided such as the numerical value of the current "BIT COUNT" which would indicate to the operator of the machine which lead was not properly inserted into the printed circuit board.

Referring again to step 164, it is to be noted that if the positional bit value read in step 162 is zero, then the central processor proceeds along a "NO" path and returns to step 150. This means that the absence of a lead originally detected in step 148 has been found to be entirely acceptable in step 164.

In this manner, the actual sensing of the presence or absence of leads can be implemented for any component. Anytime a lead is not detected in step 148, the central processor proceeds through steps 154 to 158 to first check on the operability of the particular lead sensor. The central processor then consults the table for lead information in step 160 and normally verifies that a lead should not in fact have been sensed. This allows the central processor to return to step 150 wherein the next bit from the stored data bits will be defined and fetched unless all twenty bits have been processed. It is to be noted that the only time that this will not occur is if the absence of a lead detected in step 148 is found to not be acceptable in step 164. In this case, the central processor exits from the process of checking the next lead and alerts the operator that a missed insertion has occurred in step 168.

In summary, the computer program of FIGS. 8–8C is seen to directly interface with the machine control program of a component insertion machine at the point where the printed circuit board has been positioned for receipt of the component. Before such receipt actually occurs, the computer program verifies that the lead sensors underneath the printed circuit board are in fact functioning in a predictable manner. This is accomplished by reading and storing the binary status of the lead sensors in steps 104 and 106 and comparing the same with tabulated binary data concerning the operative status of the lead sensors in steps 108 through 122. Normally all lead sensors will be expected to be operative. In the event that the status of a lead sensor is found to be other than that expected, the computer program disables the insertion machine and transmits a message to the operator in steps 124 and 126. Usually, all lead sensors will be found to be functioning properly and the computer will proceed to authorize actual insertion of the component leads into the printed circuit board in step 128. When this insertion is completed in step 130, the computer proceeds to read and examine a particularly defined coding concerning the inserted leads. This coding is read and stored in steps 132 and 134. If the coding is zero in step 136 the computer will proceed to authorize the cutting and clinching of the component in step 138. The coding will however normally not be zero which will prompt the computer to again read and store the binary status of the lead sensors in steps 140 and 142. The computer will now proceed to examine the stored binary status of each lead sensor to ascertain whether a lead has been sensed in steps 144 through 152. In the event that a lead is not sensed, the computer will confirm the operative status of the particular lead sensor in steps 154 and 158 before consulting a table of lead information in step 160. The table of lead information in FIG. 9 is preferably organized as individual twenty bit data fields for each component coding. The particular data field for the read and stored component coding of step 134 is consulted and the particular bit corresponding to the numbered lead sensor then being examined is called forth in step 162. If this bit confirms the absence of a lead, the computer proceeds to examine the binary status of the next lead sensor. On the other hand, if the then examined lead sensor should have sensed a lead, the computer proceeds to disable the insertion machine and alerts the operator as to a missed insertion in steps 166 and 168. It is to be understood that normal operation of the program would result in the sensed absence of any inserted lead being appropriately confirmed in steps 160 and 162. This would allow the computer to return to the machine control program in step 138 after the twentieth lead sensor has been checked in step 150.

It is to be understood from the above that a preferred embodiment has been disclosed for a programmed computer system which interfaces with a fiber optic lead sensing arrangement. The read-out of the fiber optic lead sensing is accomplished in such a manner as to allow for any combination of leads to be present on a dual-in-line component varying in size from a two pin DIP to a twenty pin DIP. It is to be appreciated that the maximum component size of twenty pins or leads could be either decreased or increased without departing from the scope of the invention. It is furthermore to be appreciated that various portions of the computer system and the computer program associated therewith could be changed without departing from the scope of the invention.

What is claimed is:

1. In a component insertion machine wherein the leads of components are inserted through holes in a medium after the medium has been positioned for receipt of the leads through the holes, a system for determining whether the leads are properly inserted through the holes in the medium, said system comprising:
   a plurality of optical sensors, located below the positioned medium, each optical sensor individually sensing the presence or absence of only one respective lead of the component extending beneath the medium;
   means for reading the status of each of said plurality of optical sensors after the component leads have been inserted into the holes in the positioned medium; and
   means for verifying that the status of each optical sensor is in accordance with a predetermined status for that particular optical sensor.

2. The system of claim 1 wherein each component to be processed by the insertion machine possesses a code relating to the leads present on the component and said means for verifying that the status of each optical sensor is in accordance with a predetermined status for that particular optical sensor comprises:
   means for storing information defining the presence or absence of a lead with respect to each optical sensor for each component that is to be processed by the component insertion machine;
   means for reading the code for the component having leads which are to be inserted; and
   means, responsive to the reading of the code, for accessing the stored information for the component having leads which are to be inserted, the stored information defining the presence or absence of a component lead with respect to each optical sensor whereby the presence or absence of an inserted lead may be verified.

3. The system of claim 2 wherein said means for verifying that the status of each optical sensor is in accordance with a predetermined status for that optical sensor further comprises:
   means for comparing the status of each optical sensor with a specific value assigned to that optical sensor from the stored information.

4. The system of claim 3 wherein said means for verifying that the thus read status of each optical sensor is in accordance with a predetermined status for that optical sensor still further comprises:
   means for comparing the status of an optical sensor with a predetermined value indicating the presence of a component lead whereby the detected presence of a component lead negates the comparison of the status of the optical sensor with a specific value assigned to the optical sensor from the stored information.

5. The system of claim 1 wherein said means for verifying that the status of each optical sensor is in accordance with a predetermined status for that particular optical sensor comprises:
   means for comparing the status of an optical sensor with a predetermined value; and
   means for further comparing the status of an optical sensor with a specific value assigned to the optical sensor when the status of the optical sensor is not equal to the predetermined value.

6. The system of claim 1 further comprising:
   means for authorizing the cutting and clinching of the inserted leads when the status of each optical sensor is in accordance with the predetermined status for that particular optical sensor.

7. The system of claim 6 further comprising:
   means for disabling the cutting and clinching process of the component insertion machine when the status of at least one optical sensor is not in accordance with the predetermined status for that particular optical sensor.

8. The system of claim 7 further comprising:
   means for transmitting a message indicating a missed lead insertion when the status of an optical sensor is not in accordance with the predetermined status for that particular optical sensor.

9. The system of claim 1 further comprising:
   means for checking whether said plurality of optical sensors are functioning in a predetermined manner before the insertion of the leads into the medium.

10. The system of claim 9 further comprising:
    means for disabling the cutting and clinching process of the insertion machine when at least one of said plurality of sensors is found not to be functioning in the predetermined manner.

11. The system of claim 9 or 10 further comprising:
    means for transmitting a message indicating a sensor is not functioning properly when at least one of said plurality of sensors is found not to be functioning in the predetermined manner.

12. The system of claim 1 wherein said plurality of optical sensors comprise:
    a first plurality of fiber optic filaments transferring light from a light source onto the leads of the component; and
    a second plurality of fiber optic filaments, each capable of transferring reflected light to a respective photo transducer.

13. The system of claim 12 further comprising means for mounting said first and second plurality of fiber optic filaments within a cut and clinch mechanism of the component insertion machine.

14. The system of claim 12 or 13 wherein each respective photo transducer is connected to an operational amplifier so as to provide either of two binary signal conditions indicative of the status of the photo transducer.

* * * * *

REEXAMINATION CERTIFICATE (946th)
United States Patent [19]
[11] B1 4,549,087

Duncen et al.

[45] Certificate Issued Nov. 8, 1988

[54] LEAD SENSING SYSTEM

[75] Inventors: Robert J. Duncen, Magnolia; Richard B. Maxner, Danvers; Jean A. McLean, South Hamilton; William H. Mirley, Jr., North Reading, all of Mass.

[73] Assignee: USM Corporation, Farmington, Conn.

Reexamination Request:
No. 90/001,365, Nov. 2, 1987

Reexamination Certificate for:
Patent No.: 4,549,087
Issued: Oct. 22, 1985
Appl. No.: 451,921
Filed: Dec. 27, 1982

[51] Int. Cl.⁴ .............................................. G01N 21/86
[52] U.S. Cl. ............................. 250/561; 250/223 R; 250/227; 29/566.3
[58] Field of Search .................. 250/223 R, 561, 227; 324/73 PC; 140/139, 147; 364/475; 29/566.3, 564.1; 356/399, 400, 241

[56] References Cited
U.S. PATENT DOCUMENTS

| | | | |
|---|---|---|---|
| 3,704,362 | 11/1972 | Kolby et al. | 340/419 |
| 3,771,325 | 11/1973 | Sweeney et al. | 250/227 |
| 3,908,118 | 9/1975 | Micka | 250/572 |
| 4,367,584 | 9/1980 | Janisiewicz et al. | 29/837 |
| 4,485,548 | 3/1982 | Janisiewicz | 29/705 |
| 4,496,971 | 1/1985 | West et al. | 358/106 |
| 4,499,649 | 8/1982 | Maxner | 250/227 |

FOREIGN PATENT DOCUMENTS 57-23299  2/1982  Japan .

*Primary Examiner*—David C. Nelms

[57] ABSTRACT

A system is disclosed for checking on the presence or absence of inserted leads of a component into the openings of a printed circuit board. The system is utilized within a component insertion machine wherein a plurality of optical lead sensors are preferably located within the cut and clinch mechanism. A computer system associated with the optical lead sensors compares the optical readings of the lead sensors with predefined data relating to the presence or absence of leads for each particular component being inserted.

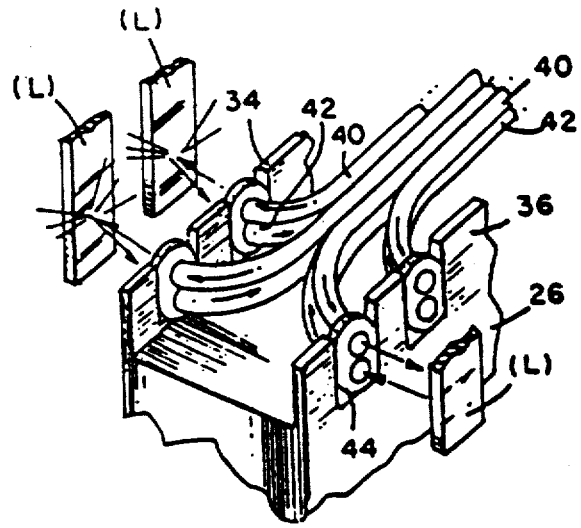

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2-14, dependent on an amended claim, are determined to be patentable.

New claim 15 is added and determined to be patentable.

1. In a [component insertion] machine *for inserting a DIP electronic component having a plurality of leads arranged in opposed parallel rows* wherein the leads of [components] *the component* are inserted through holes in a [medium] *circuit board* after the [medium] *circuit board* has been positioned for receipt of the leads through the holes, a system for determining whether the leads are properly inserted through the holes in the [medium] *circuit board*, said system comprising:

means for illuminating the inserted leads to simultaneously define a predetermined lighting condition on a selected portion of each inserted lead, a *corresponding* plurality of optical [sensors,] *sensor means each including*

*an optical sensor* located below the positioned [medium, each optical sensor] *circuit board and spaced from a respective inserted lead for* individually sensing the presence or absence of [only one] *said predetermined lighting condition on the selected portion of said* respective lead [of the component extending beneath the medium]; *and*

*means for presenting in readable form the status of said optical sensor;* means for reading the status of each of said plurality of optical sensors [after the component leads have been inserted into the holes in the positioned medium] *while said inserted leads are illuminated to simultaneously define the predetermined lighting condition on the selected portion of each inserted lead*; and means for verifying that the status of each optical sensor is in accordance with a predetermined status for that particular optical sensor.

*15. A system according to claim 1, wherein said predetermined lighting condition is right.*

* * * * *